United States Patent
Sato

(10) Patent No.: US 6,879,027 B2
(45) Date of Patent: Apr. 12, 2005

(54) SEMICONDUCTOR DEVICE HAVING BUMPS

(75) Inventor: Koji Sato, Akishima (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 153 days.

(21) Appl. No.: 09/998,467

(22) Filed: Nov. 29, 2001

(65) Prior Publication Data

US 2002/0063316 A1 May 30, 2002

(30) Foreign Application Priority Data

Nov. 30, 2000 (JP) ........................................ 2000-364401

(51) Int. Cl.[7] .............................................. H01L 23/495
(52) U.S. Cl. ........................ 257/673; 257/666; 257/737; 257/738
(58) Field of Search ................................. 257/666, 673, 257/737, 738, 779–794

(56) References Cited

U.S. PATENT DOCUMENTS

| | | | | |
|---|---|---|---|---|
| 3,868,724 A | * | 2/1975 | Perrino | 357/65 |
| 4,273,859 A | * | 6/1981 | Mones et al. | 430/315 |
| 4,701,363 A | * | 10/1987 | Barber | 428/137 |
| 5,010,389 A | * | 4/1991 | Gansauge et al. | 357/67 |
| 5,268,072 A | * | 12/1993 | Agarwala et al. | 156/664 |
| 5,736,456 A | * | 4/1998 | Akram | 438/614 |
| 5,773,359 A | * | 6/1998 | Mitchell et al. | 438/614 |
| 5,821,627 A | * | 10/1998 | Mori et al. | 257/780 |
| 5,900,671 A | * | 5/1999 | Takahashi et al. | 257/735 |
| 5,937,320 A | * | 8/1999 | Andricacos et al. | 438/614 |
| 5,943,597 A | * | 8/1999 | Kleffner et al. | 438/613 |
| 6,018,189 A | * | 1/2000 | Mizuno | 257/668 |
| 2001/0002163 A1 | * | 5/2001 | Imasu et al. | 361/783 |
| 2002/0000650 A1 | * | 1/2002 | Smith et al. | 257/692 |

FOREIGN PATENT DOCUMENTS

| | | | | |
|---|---|---|---|---|
| JP | 357120352 A | * | 7/1982 | ........... H01L/21/92 |
| JP | 360031245 | * | 2/1985 | ........... H01L/21/92 |
| JP | 401008647 | * | 1/1989 | ........... H01L/21/92 |
| JP | 406077233 | * | 8/1992 | ......... H01L/21/321 |

* cited by examiner

*Primary Examiner*—Amir Zarabian
*Assistant Examiner*—Monica Lewis
(74) *Attorney, Agent, or Firm*—Koda & Androlia

(57) ABSTRACT

In a semiconductor device, each of the leads is provided with guided-surfaces that are inclined surfaces and each of the bumps is provided with a recess that has guide-surfaces formed by inclined surfaces. The leads are smoothly guided toward the centers of the upper surfaces of the bumps with the aides of the inclined surfaces formed on the leads and bumps, so that the attitude of the leads is corrected and the leads are snugly brought into the recess and prevented form falling off of the bump.

4 Claims, 6 Drawing Sheets

SEMICONDUCTOR DEVICE HAVING BUMPS

BACKGROUND OF THE INVENTION

1. Field of the Invention

The present invention relates to a semiconductor device and to a method for manufacturing semiconductor devices that reduces the size of semiconductor devices and improves the yield.

2. Prior Art

One type of semiconductor device assembly method is a tape carrier method. Essentially, in this assembly method, as seen from FIG. 7, numerous leads 76 consisting of a conductive layer are formed on the upper surface of a carrier film 2 that is made of a band-form heat-resistant resin film. Then, these leads 76 are bonded to bumps that are surface electrodes of semiconductor chips 78. In addition, these elements are sealed with a resin.

More specifically, in this tape carrier method, the tip ends of the leads 76 formed on the surface of the carrier film 2, as seen from FIG. 8, overhang from windows 2a of the carrier film 2, and the semiconductor chip 78 is caused to approach the leads 76 from below. Then, the leads 76 and bumps 80 are thermally fused while being heated and pressed from above by a bonding tool that has a heater, thus bonding the leads 76 and bumps 80. Bonding of the leads 76 and bumps 80 can be done by another way. A molten resin material in which a conductive powder is dispersed and held is applied to the interfacial surfaces of the leads 76 and bumps 80 and then hardened.

In recent years, a flip-chip method is also used. In this method, as seen from FIG. 9, leads 76 are formed on the surface of a carrier film 82, and semiconductor chips 78 that are set upside down are caused to approach the leads 76 from above, and boding is performed on the leads and bumps.

However, even in this flip-chip method, there are problems. When achieving a finer pitch, it is likely that more defective products are produced, thus causing yield drop. A detailed investigation of such defective products done by the inventor found the causes of such defective bonding. When the lead 76 contacts a position that is away from the center of the corresponding bump 80, the application of pressure in this state causes the lead 76 to slip on the upper surface of the bump 80 as shown in FIG. 10. As a result, the deviation S increases, and the lead 76 falls from the upper surface of the bump 80.

SUMMARY OF THE INVENTION

Accordingly, the object of the present invention is to provide a semiconductor device that, in its manufacturing process, is able to prevent slipping between the leads and bumps, thus preventing falling of the leads from the bumps.

A further object of the present invention is to provide a manufacturing method of semiconductor devices that is able to realize a much greater reduction in the size of semiconductor devices and also realize an improvement in the yield.

The above object is accomplished by a unique structure for a semiconductor device in which bumps formed on the surface of a semiconductor chip and leads are set to face each other and bonded, wherein a recess is formed in the surface of each one of the bumps that faces a lead, the recess comprises guide-surfaces that are inclined surfaces and are formed between the bottom of the recess and the opening edges of the recess, and each of the leads is provided with a projection at one end thereof, the projection being to be bonded to a bump and provided with guided-surfaces that are inclined surfaces.

In this structure, when the bump and the lead are faced and pressed each other, the lead is guided toward the center of the upper surface (or the bottom) of the bump by the guide-surfaces of the bump and by the guided-surfaces of the lead that are inclined. Accordingly, even when the lead contacts a position that is away from the center of the bump, the lead does not fall from the bump. Furthermore, since the lead is guided by the inclined surfaces, a stress acts toward the lead from the opening edges of the bump, and the lead is held firmly on the bump. Accordingly, an assured bonding is performed, reduced size semiconductor devices are produced, and it is possible to realize the improvement in the yield.

In the above structure, the inclined guide-surfaces are formed for the entire periphery of the recess of each bump. Also, the guided-surface are formed so as to be inclined for the entire periphery of each lead and so as to surround a bonding point (a point that is bonded to the corresponding bump) of the lead.

Accordingly, the lead is guided into the recess of the bump from any directions around the entire periphery of the lead.

Furthermore, in the above semiconductor device, the width of the end surface of the lead that faces the bump is set to be narrower than the width of the lead.

By way of designing the end surface of the lead that faces the bump so as to be narrower than the width of the lead, the lead is accurately guided into the recess of the bump. In addition, this structure provides the lead with a structural strength, the deformation thereof is thus prevented, and it is ideal for meeting a required finer pitch.

The above object is further accomplished by unique steps of the present invention for a method for manufacturing a semiconductor device in which bumps formed on the surface of a semiconductor chip and leads are set to face each other and bonded; and in the present invention, the method includes:

a step of forming a recess in the surface of each of the bumps that faces the lead, the recess having inclined surfaces between the bottom of the recess and the opening edges of the recess, and a step of forming a projection at one end of each of the leads, the projection being to be bonded to each of the bumps and provided with guided-surfaces that are inclined surfaces In this method, each bump has guide-surfaces that are inclined surfaces and each lead has guided-surfaces that are inclined surfaces that mate the inclined surfaces of the bump. Accordingly, when the bump and the lead are faced and pressed each other, the lead is guided into the center of the upper surface (or the bottom) of the bump by the guide-surfaces of the bump and the guided-surfaces of the lead. Accordingly, even when the lead contacts a position that is away from the center of the bump, the lead does not fall from the upper surface of the bump. Furthermore, since the lead is guided by the inclined surfaces of the bump, a stress acts toward the lead from the opening edges of the bump, and the lead is held firmly on the bump. Thus, bonding is performed securely, reduced size semiconductor devices can be produced, and it is possible to realize the improvement in the yield.

In the above method, the inclined guide-surfaces are formed around the entire periphery of the recess of each bump, and the guided-surfaces are formed around the entire periphery of the bonding point (a point that is bonded to the corresponding bump) of each lead. Thus, the lead is guided into the recess of the bump from any directions around the entire periphery of the lead.

Furthermore, in the above method, the width of the end surface of a lead that faces a bump is formed so as to be narrower than the width of the lead. Since the end surface of the lead that faces the bump is narrower than the width of the lead, the lead is accurately guided into the recess of the bump. In addition, the lead has a structural strength, the deformation thereof is prevented, and it is ideal for manufacturing finer pitch semiconductor devices.

DETAILED DESCRIPTION OF THE INVENTION

One embodiment of the present invention will be described below with reference to the accompanying drawings.

Figure 1:
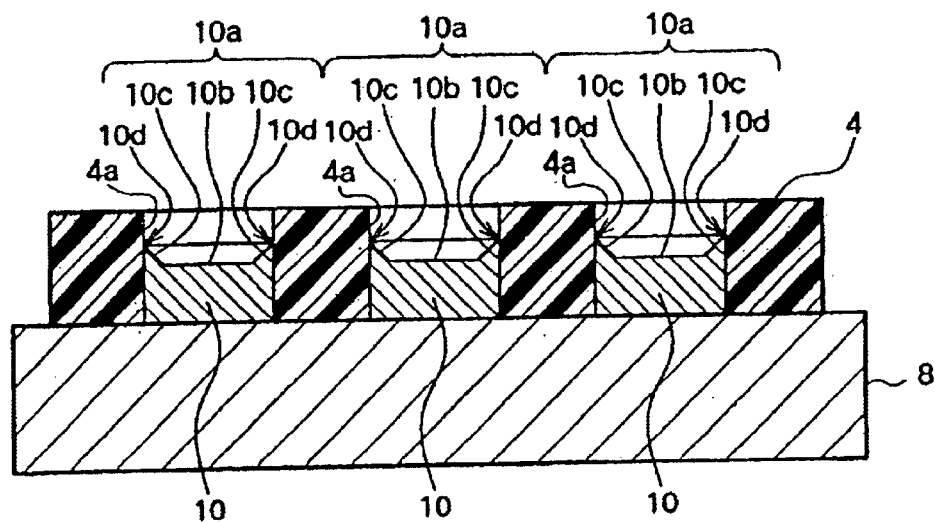
FIG. 1 is a front view in cross section that illustrates the bump formation process in one embodiment of the present invention.

FIG. 1 shows the formation of bumps 10. The bumps 10 are formed by electroplating.

More specifically, a mask layer 4 consisting of a synthetic resin is first formed by a silkscreen process on portions of the surface of the semiconductor chip 8 except for the electrodes (not shown). As a result, through-holes 4a are formed in the mask layer 4. Next, this semiconductor chip 8 is subjected to electroplating, so that a gold-plating layer is grown on the electrodes. The growth of this gold-plating layer is not performed to the point that the gold-plating layer reaches the edges of the through-holes 4a in the mask layer 4. Instead, this growth is completed at an intermediate point in the depth of each through-hole 4a. The growth of the gold-plating layer proceeds along the peripheral wall surfaces of the through-holes 4a; as a result, a recess 10a is formed in the upper surface of each bump 10. Then, the mask layer 4 is removed by solvent.

Figure 2:
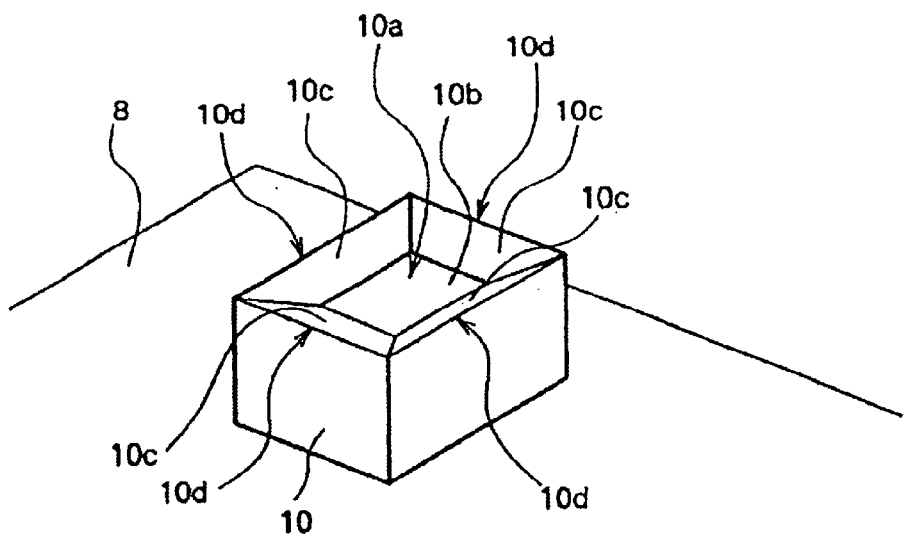
FIG. 2 is a perspective view of an obtained bump.

As shown in FIG. 2, the recess 10a has the shape of a truncated square pyramid, and it has inclined guide-surfaces 10c between the bottom 10b and the opening edges 10d.

Figure 3A:
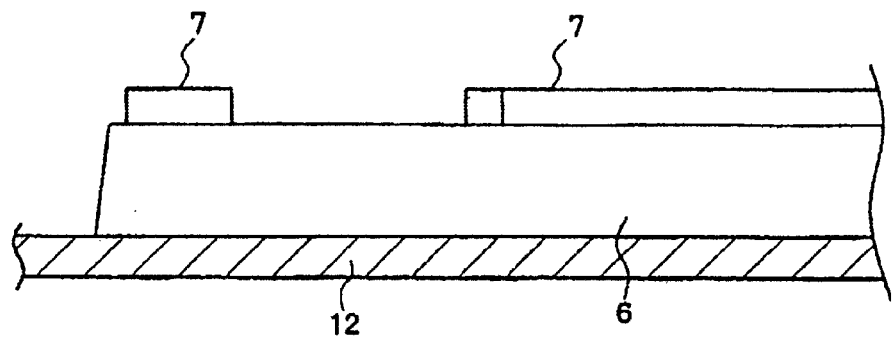
FIG. 3A is a side view of a lead in the lead-side-bump formation process.
Figure 3B:
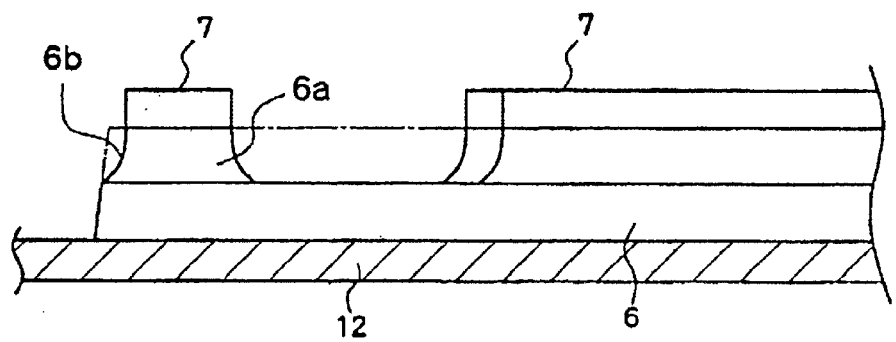
FIG. 3B shows a lead in the lead-side-bump formation process in which half-etching has been performed.

FIGS. 3A and 3B illustrate the process of forming a projection or a lead-side-bumps 6a on a lead 6.

First, mask layers 7 consisting of a synthetic resin are formed on the tip end portion and base portion (with respect to the direction of length) of the surface of each lead 6 that is held on a carrier film 12. This surface that has the mask layers 7 is one that faces a corresponding bump 10 (i.e., the upper surface in FIG. 3A).

Next, this lead 6 is subjected to half-etching as shown in FIG. 3B. As a result, the portions of the lead 6 that are not masked by the masking layers 7 are etched and removed. Here, a projection or a lead-side-bump 6a is formed at the tip end portion of the lead 6 that is masked by the masking layer 7. Since the etching acts uniformly on the surfaces of the material of the lead 6, the side surfaces of the lead-side-bump 6a are formed as a guided-surface 6b. The side surfaces of the guided-surface 6b are inclined outward from the upper surface side (that faces the corresponding bump 10) toward the lower surface side. Then, the mask layers 7 on the lead 6 are removed by solvent.

Figure 4:
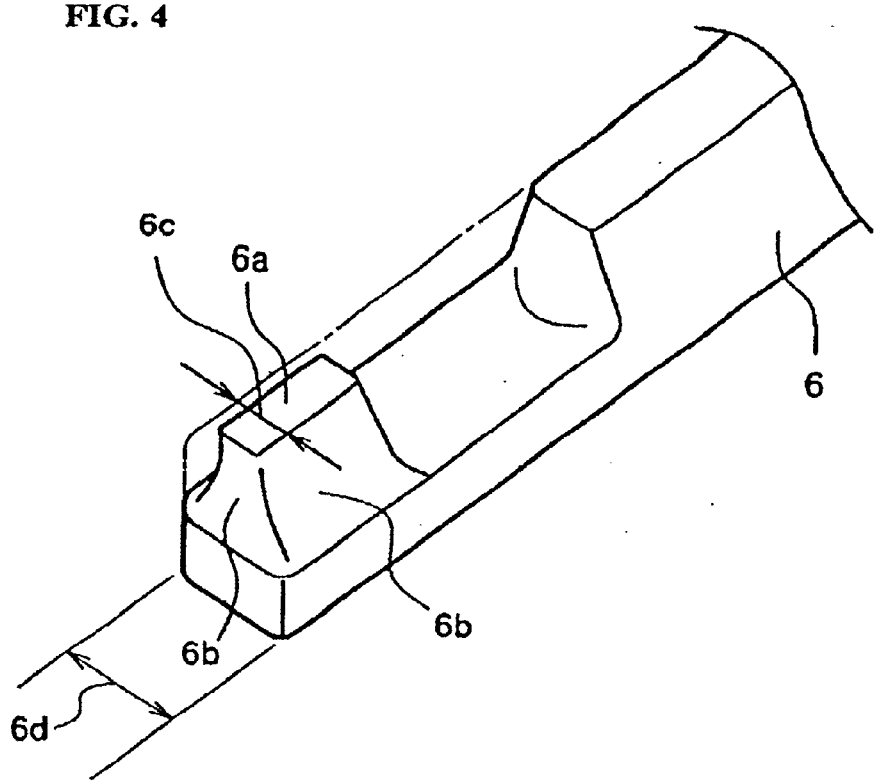
FIG. 4 is a perspective view of a tip end portion of a lead.

As shown in FIG. 4, the guided-surface 6b of each lead-side-bump 6a is formed around the entire periphery of the lead-side-bump 6a.

Figure 5:
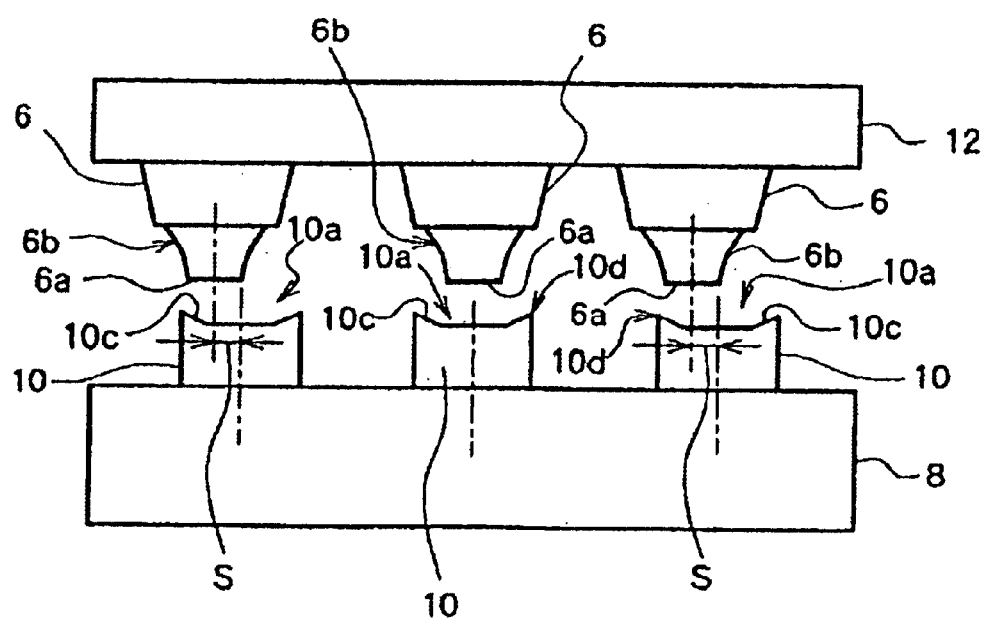
FIG. 5 is a front view that illustrates the bonding process of the leads and bumps, showing that the leads and bumps face each other.
Figure 6:
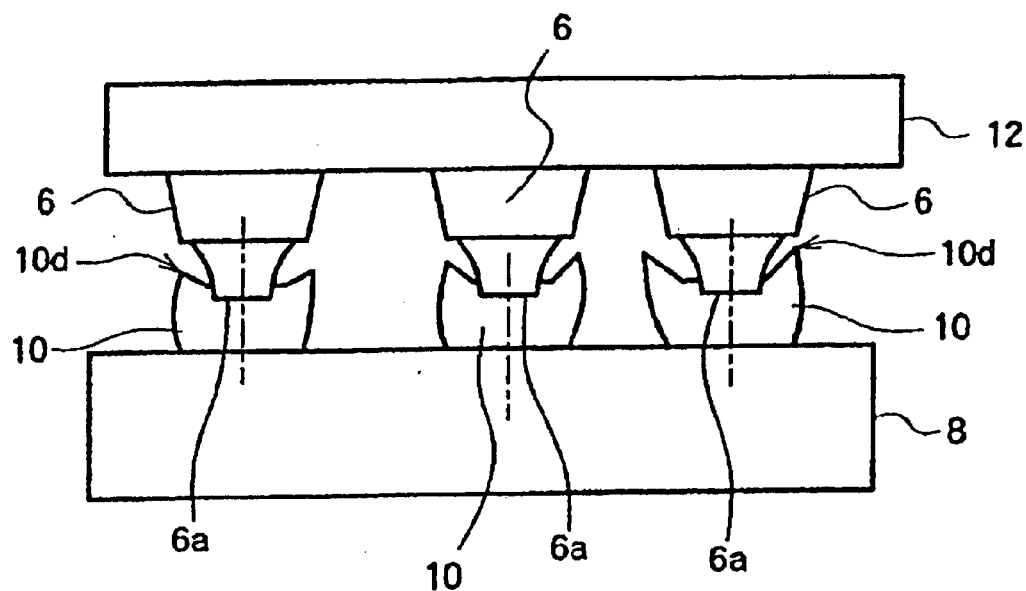
FIG. 6 is a front view that illustrates the bonding process of the leads and bumps, showing that the leads and bumps are pressed.
Figure 7:
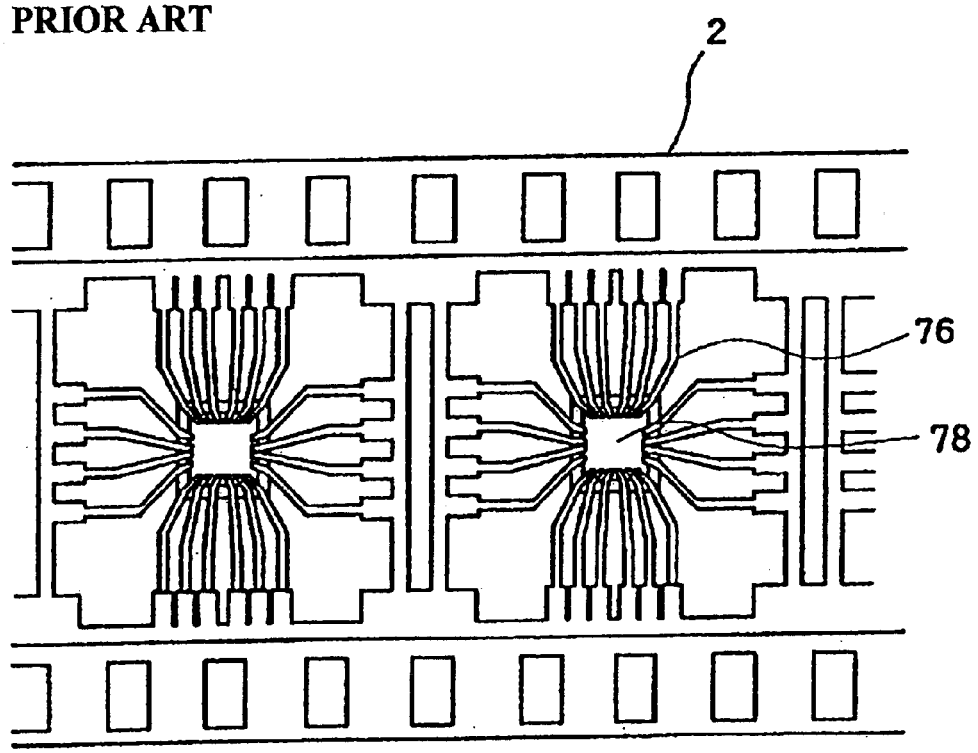
FIG. 7 is a top view of a semiconductor device in one step of a prior art semiconductor device manufacturing process that uses a carrier film.
Figure 8:
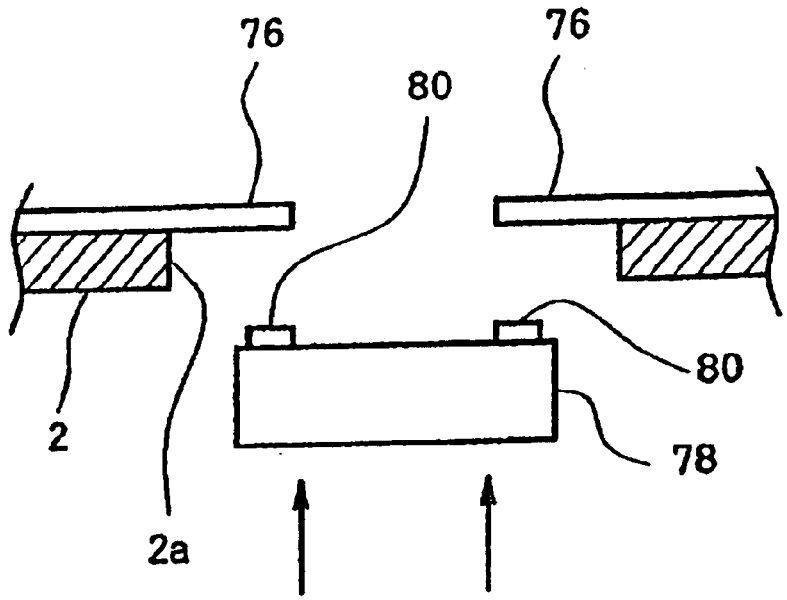
FIG. 8 is a side view of a semiconductor device in one step of a prior art semiconductor device manufacturing process that uses a carrier film.
Figure 9:
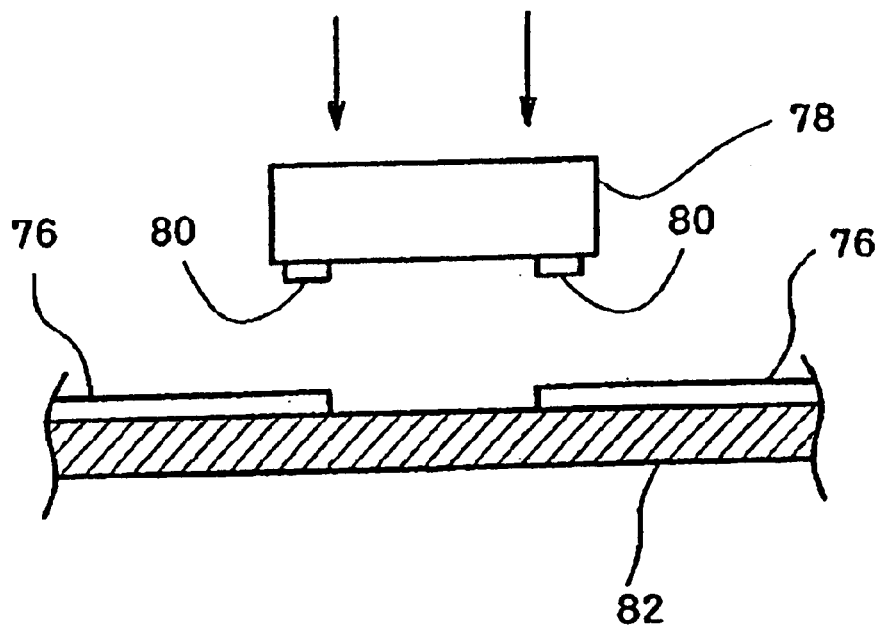
FIG. 9 is a side view of a semiconductor device in one step of a prior art semiconductor device manufacturing process that uses flip-chip method.
Figure 10:
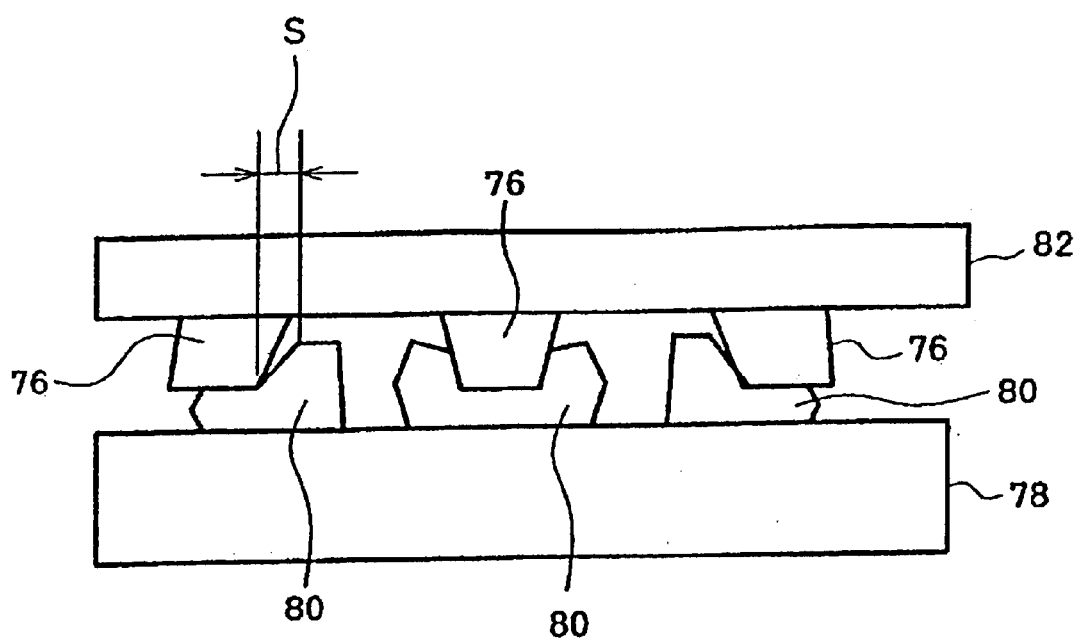
FIG. 10 is a front view illustrating a defective lead and bump bonding in a conventional semiconductor device.

The bonding of the leads 6 and bumps 10 is performed using a gang bonding method in which all bonding is performed simultaneously for a single semiconductor chip 8. As shown in FIG. 5, the carrier film 12 and semiconductor chip 8 are positioned in relative terms so that the leads 6 and bumps 10 are set to face each other. Then, beginning from this state, the respective leads 6 and bumps 10 are pressed toward each other by means of a heated bonding tool (not shown) as shown in FIG. 6. The width 6c (see FIG. 4) of the surfaces of the leads 6 that face the bumps 10 in FIG. 5 is approximately 6 to 8 micrometers ($\mu$m).

Here, as shown in FIGS. 5 and 6, the center of the lead 6 located in the central position more or less coincides with the center of the corresponding bump 10. Accordingly, during bonding, the lead-side-bump 6a contacts the bottom 10b of the corresponding bump 10 from the beginning and is bonded so that the lead-side-bump 6a bites of the lead 6 into the bump 10.

On the other hand, the centers of the leads 6 located in the left and right positions deviate from the centers of the corresponding bumps 10, and these leads 6 contact the corresponding bumps 10 with a deviation S of, for instance, approximately 5 to 7 micrometers ($\mu$m). However, when the leads 6 and bumps 10 are pressed, the leads 6 are guided toward the centers of the upper surfaces of the bumps 10 via the inclined guide-surfaces 10c of the bumps 10 and the guided-surfaces 6b (that are also inclined) of the leads 6. As a result, the attitudes of the leads 6 are corrected. Furthermore, as a result of the leads 6 being guided, stress acts toward the guided-surface 6b of the lead-side-bumps 6a from the opening edges 10d of the bumps 10. As a result, the leads 6 are firmly held on the bumps 10. In this case, the change in the attitudes of the leads 6 is accomplished while causing deformation of the carrier film 12 or is accomplished with the constraint of the leads 6 released as a result of the leads 6 leaving the carrier film 12.

Then, in this state, the leads 6 and bumps 10 are bonded by way of thermal fusion.

In the above embodiment, the leads 6 (more specifically the projections of the leads) are guided toward the centers of the upper surfaces of the bumps 10 by the inclined guide-surfaces 10c of the recesses 10a of the bumps 10 and by the inclined guided-surfaces 6b of the leads 6. Accordingly, even in cases where the leads (or projections thereof) 6 contact the bumps 10 in positions that are away from the centers of the bumps 10, the leads 6 are prevented from slipping off of the upper surfaces of the bumps 10. In addition, since the leads 6 are thus guided, stress acts toward the leads 6 from the opening edges of the bumps 10, so that the leads 6 are firmly held on the bumps 10. Accordingly, bonding is performed more securely, and a much greater reduction in the size of the semiconductor device is realized. In addition, the yield is increased.

Furthermore, the inclined guide-surfaces 10c are formed around the entire circumference of the recess 10a of each bump 10. Also, the guided-surface 6b that are also inclined are formed around the entire circumference of each lead 6 so as to surround the bonding point (an area that is bonded to the corresponding bump 10) of the lead. Accordingly, guidance of the leads 6 by the guide-surfaces 10c and guided-surface 6b is performed with accuracy in any directions around the entire circumference.

Furthermore, as seen from FIG. 4, the width 6c of the surfaces of each lead 6 that face the bumps 10 is formed so as to be narrower than the width 6d of the leads 6. Accordingly, the edge portions of the surfaces of the leads 6 that face the bumps 10 are guided with higher reliability by the inclined guide-surfaces 10c of the bumps 10. As a result, the leads 6 are guided accurately. In addition, since the width 6d of each lead 6 is wider than the width 6c of the surface that faces a bump 10, the strength of the leads 6 is ensured, a deformation thereof is suppressed. Thus, it is ideal for obtaining a finer pitch.

In the shown embodiment, the recesses 10a are formed by way of interrupting the formation of the electroplating layers of the bumps 10. The recesses 10a, however, can be formed by other methods. The recesses can be made by way of cutting or etching the upper surfaces of the bumps 10.

Moreover, in the above embodiment, the lead-side-bumps 6a are formed by way of half-etching the leads 6. However, the lead-side-bumps 6a can be formed by other methods. One way to form the lead-side-bumps 6a or a projection on each of the leads 6 is to cut the lead 6 so that a portion that makes the lead-side-bumps 6a or a projection is allowed not to be cut and remain. Another way is to separately form the lead-side-bumps 6a or projections and bond them to the leads 6.

Furthermore, in the above embodiment, the inclined guide-surfaces 10c are formed around the entire circumference of the recess 10a of each bump 10, and guided-surface 6b are formed so as to incline around the entire circumference of each lead-side-bump 6a. However, the guide-surfaces 10c and/or the guided-surfaces 6b can be formed partially with reference to the entire circumference of each bump and each lead. For instance, it is possible to form the guided-surface 6b only on the left and right surfaces of the lead 6 with respect to the direction of width and form the guide-surfaces 10c in two places in the recesses 10a so as to correspond to such a guided-surface 6b.

In the above embodiment, the leads 6 and bumps 10 are bonded by thermal fusion. However, the leads 6 and bumps 10 can be bonded by various other known methods. Thus, they can be bonded by a synthetic resin material in which a conductive powder is dispersed and held. Such methods are within the scope of the present invention.

What is claimed is:

1. A semiconductor device in which bumps formed on a surface of a semiconductor chip and leads of a lead frame are set to face each other and all simultaneously thermally bonded together, wherein:

each one said bumps on said surface of said semiconductor chip is provided with a recess in a surface thereof that faces each of said leads of said lead frame, the recess being in the shape of an inverted truncated pyramid and comprising guide-surfaces that are inclined surfaces and are formed between a bottom of said recess and opening edges of said recess; and each of said leads of said lead frame is provided with a projection formed at one end thereof so as to be bonded to each of said bumps, said projection being formed with guided-surfaces that are inclined surfaces.

2. The semiconductor device according to claim 1, wherein said guide-surfaces are formed for an entire periphery of said recess of said each one of said bumps, and said guided-surfaces are formed so as to surround a bonding point of said lead.

3. The semiconductor device according to claim 1, wherein a width of an end surface of each of said leads that faces a bump is narrower than a width of said lead.

4. The semiconductor device according to claim 2, wherein a width of an end surface of each of said leads that faces a bump is narrower than a width of said lead.

* * * * *